US009171606B2

(12) United States Patent
Kajigaya

(10) Patent No.: US 9,171,606 B2
(45) Date of Patent: *Oct. 27, 2015

(54) SEMICONDUCTOR DEVICE HAVING COMPLEMENTARY BIT LINE PAIR

(71) Applicant: PS4 LUXCO S.A.R.L., Luxembourg (LU)

(72) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/272,575

(22) Filed: May 8, 2014

(65) Prior Publication Data

US 2014/0241088 A1  Aug. 28, 2014

Related U.S. Application Data

(63) Continuation of application No. 13/360,394, filed on Jan. 27, 2012, now Pat. No. 8,773,935.

(30) Foreign Application Priority Data

Jan. 31, 2011  (JP) .................................. 2011-019134

(51) Int. Cl.
| | |
|---|---|
| *G11C 11/4097* | (2006.01) |
| *G11C 11/4091* | (2006.01) |
| *G11C 11/4096* | (2006.01) |
| *G11C 11/4099* | (2006.01) |
| *G11C 11/4094* | (2006.01) |

(52) U.S. Cl.
CPC ........ *G11C 11/4091* (2013.01); *G11C 11/4094* (2013.01); *G11C 11/4096* (2013.01); *G11C 11/4099* (2013.01)

(58) Field of Classification Search
CPC ..................................................... G11C 11/4097
USPC ......................................................... 365/210.1
See application file for complete search history.

(56) References Cited

U.S. PATENT DOCUMENTS

| | | | |
|---|---|---|---|
| 4,136,401 A | 1/1979 | Von Basse | |
| 5,850,366 A * | 12/1998 | Coleman, Jr. | ............... 365/210.1 |

(Continued)

FOREIGN PATENT DOCUMENTS

| | | |
|---|---|---|
| JP | 52-66342 | 6/1977 |
| JP | 62-71090 A | 4/1987 |

(Continued)

*Primary Examiner* — Min Huang

(57) ABSTRACT

Disclosed herein is a semiconductor device comprising complementary pair of bit lines, memory cells connected to the bit lines, dummy cells having the same structure as the memory cells, a differential sense amplifier, an equalizing circuit equalizing potentials of the bit lines, and a control circuit. The memory cells are disconnected from the bit lines and the dummy cells are connected to the bit lines, and subsequently the bit lines are equalized by the equalizing circuit. When accessing a selected memory cell, the equalizing circuit is inactivated, a corresponding dummy cell is disconnected from the bit line, and subsequently the selected memory cell is connected to the bit line. Thereafter, the sense amplifier is activated so that potentials of the bit lines are amplified respectively.

8 Claims, 7 Drawing Sheets

(56) References Cited

U.S. PATENT DOCUMENTS

| | | | |
|---|---|---|---|
| 6,023,438 A * | 2/2000 | Tanaka et al. | 365/207 |
| 6,288,961 B1 | 9/2001 | Tanaka et al. | |
| 6,731,556 B2 * | 5/2004 | Derner et al. | 365/189.09 |
| 2002/0060924 A1 * | 5/2002 | Ito | 365/149 |
| 2003/0095446 A1 * | 5/2003 | Kaihatsu | 365/200 |
| 2005/0281110 A1 * | 12/2005 | Hokari et al. | 365/210 |
| 2007/0177443 A1 * | 8/2007 | Ohsawa | 365/210 |
| 2012/0036315 A1 * | 2/2012 | Reohr et al. | 711/105 |

FOREIGN PATENT DOCUMENTS

| | | |
|---|---|---|
| JP | 62-71091 A | 4/1987 |
| JP | 63-228491 A | 9/1988 |
| JP | 07-153258 A | 6/1995 |
| JP | 07-201199 A | 8/1995 |
| JP | 9-082084 A | 3/1997 |
| JP | 11-149785 A | 6/1999 |

* cited by examiner

SEMICONDUCTOR DEVICE HAVING COMPLEMENTARY BIT LINE PAIR

This application is a Continuation application of U.S. application Ser. No. 13/360,394 filed Jan. 27, 2012, which claims the benefit of priority of Japanese Patent Application No. 2011-019134, filed Jan. 31, 2011, the disclosures of which are incorporated by reference in their entirety.

BACKGROUND OF THE INVENTION

1. Field of the Invention

The present invention relates to a semiconductor device having a configuration in which a signal voltage of a complementary bit line pair is amplified by a sense amplifier.

2. Description of Related Art

In semiconductor devices of recent years such as DRAM, operating voltages of a memory cell array have been lowered with a reduction in manufacturing scale. This causes a problem that when a signal voltage transmitted from a memory cell through a bit line is amplified by a sense amplifier in a read operation of a semiconductor device, sufficient sensing margin cannot be obtained. Thus, techniques for improving the sensing margin in the read operation have been proposed, in which dummy cells having the same structure as memory cells or dummy cells having a structure of a metallic capacitance element in the memory cell array are provided (for example, see Patent References 1 to 4).

For example, Patent Reference 1 discloses a technique in which all dummy cells connected to a bit line are brought into a selected state in a bit line equalizing operation, and after temporarily setting all the dummy cells into a non-selected state prior to a read operation, dummy cells on the side of a non-selected bit line are subsequently selected simultaneously with selected memory cells. Further, for example, Patent Reference 2 discloses a technique in which dummy cells on the side of a non-selected bit line are controlled in both an amplification operation and a bit line equalizing operation so that capacitances of a bit line pair become equal to each other. Further, for example, Patent Reference 3 discloses a technique in which memory cells and dummy cells on a non-selected bit line are selected simultaneously and thereafter the both cells are brought into a non-selected state and are disconnected from a bit line pair so that capacitances of the bit line pair become equal to each other in an amplification operation, and only memory cells selected after the amplification operation are selected again. Further, for example, Patent Reference 4 discloses a technique in which when activating a word line, a dummy word line connected to a bit line via a capacitance is driven by a predetermined driving method.

[Patent Reference 1] Japanese Patent Application Laid-open No. H7-153258
[Patent Reference 2] Japanese Patent Application Laid-open No. H9-82084
[Patent Reference 3] Japanese Patent Application Laid-open No. H11-149785 (U.S. Pat. Nos. 6,023,438 and 6,288,961)
[Patent Reference 4] Japanese Patent Application Laid-open No. H7-201199

However, even when applying the above techniques to the memory cell array, it is insufficient to improve the sensing margin in the read operation. That is, in the technique of Patent Reference 1, an increase in consumption current is inevitable when potentials of all dummy word lines are temporarily lowered. The increase in consumption current brings noise to the sense amplifier. Further, since the capacitances of the bit line pair are not balanced when a restoring operation after the read operation is finished, there is a risk that an equalizing potential that should be stabilized to VDD/2 deviates from VDD/2. Further, in the techniques of Patent References 2 and 3, potentials of the dummy cells deviate from VDD/2 in a situation where current leak occurs in the dummy cells, which causes noise to occur in the read operation and thereby the sensing margin is reduced. In order to deal with this problem, Patent Reference 2 also discloses a configuration (a transistor and a control signal) for arbitrarily setting the potentials of the dummy cells. However, this configuration inevitably requires an increase in area of the dummy cells, and additionally there arises a problem that the capacitance balance is lost due to a difference in structure between the dummy cells and the memory cells. Further, in the technique of Patent Reference 3, since the amplification operation is started after allowing the memory cells and the dummy cells to be in a non-selected state temporarily, there arise problems of a decrease in reading speed and an increase in consumption current. Meanwhile, in the technique of Patent Reference 4, since each memory cell is controlled to be in the selected state and each dummy cell is controlled to be in the non-selected state respectively at the same timing in the read operation, electric charge supplied from the memory cell to the bit line flows into the dummy cell, which reduces the signal voltage of the bit line so as to decrease the sensing margin.

SUMMARY

A semiconductor device according to an embodiment of the disclosure comprises: first and second bit lines forming a complementary pair; a first memory cell connected to the first bit line; a second memory cell connected to the second bit line; a first dummy cell connected to the first bit line, the first dummy cell having a same structure as the first memory cell; a second dummy cell connected to the second bit line, the second dummy cell having a same structure as the second memory cell; a sense amplifier amplifying a difference in potential between the first and second bit lines; an equalizing circuit equalizing potentials of the first and second bit lines to which the first and second dummy cells are connected, the first and second bit lines having potentials opposite to each other and the first and second dummy cells having potentials opposite to each other; and a control circuit controlling the first and second memory cells, the first and second dummy cells, the sense amplifier, and the equalizing circuit, wherein the control circuit performs an operation in which, in a first period as a bit line equalization period, first and second potentials opposite to each other corresponding to data amplified by the sense amplifier are stored into the first and second dummy cells respectively, in a state where the first and second memory cells are electrically disconnected from the first and second bit lines and the first and second dummy cells are electrically connected to the corresponding first and second bit lines, and subsequently the sense amplifier is inactivated while the equalizing circuit is activated so that the first and second bit lines having the first and second potentials are equalized together with the first and second dummy cells having the first and second potentials, and when accessing the first memory cell, in a second period, the equalizing circuit is inactivated, in a third period subsequent to the second period, the first dummy cell is electrically disconnected from the first bit line in a state where the second dummy cell and the second bit line continue to be electrically connected to each other, and subsequently the first memory cell is electrically connected to the first bit line, and in a fourth period subsequent to the third period, the sense amplifier is activated so that the first bit line is set to the first potential corresponding to data of the first memory cell and the second bit line and the second dummy cell are set to the second potential.

DETAILED DESCRIPTION OF THE PREFERRED EMBODIMENTS

It is apparent that the present invention is not limited to embodiments described below, but should be construed based on the disclosure of the claims.

Figure 1:
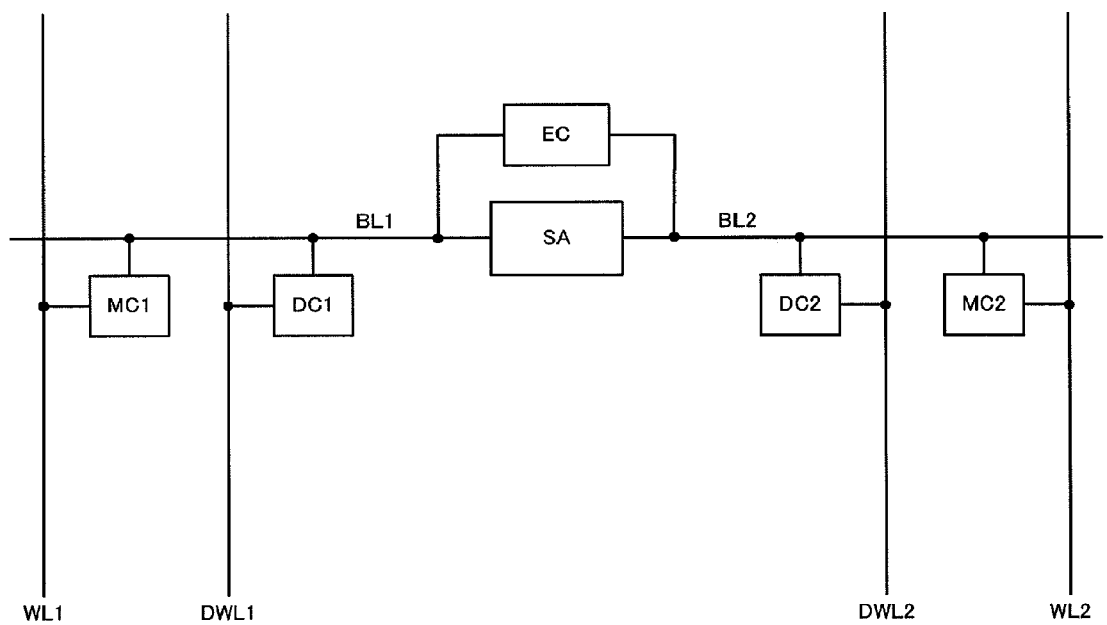
FIG. 1 is a diagram showing a schematic configuration of an embodiment of the invention.

As shown in FIG. 1, an embodiment of the invention is a semiconductor device comprising a pair of bit lines BL1 and BL2 forming a complementary pair, a memory cell MC1 and a dummy cell DC1 that belong to one bit line BL1, a memory cell MC2 and a dummy cell DC2 that belong to the other bit line BL2, a sense amplifier SA amplifying a difference in potential between the pair of bit lines BL1 and BL2, and an equalizing circuit EC equalizing the pair of bit lines BL1 and BL2. In the semiconductor device, all the memory cells MC1, MC2 and the dummy cells DC1, DC2 have the same structure. Each of the memory cells MC1, MC2 and the dummy cells DC1, DC2 is composed of one selection transistor and one capacitor that stores data. In FIG. 1, although either one of memory cells MC1 and MC2 belongs to each of the bit lines BL1 and BL2 for the simplicity, a plurality of memory cells MC1 and MC2 actually belong to each of the bit lines BL1 and BL2.

In an equalizing operation of the bit lines BL1 and BL2 in the configuration of FIG. 1, the memory cells MC1 and MC2 are electrically disconnected from the bit lines BL1 and BL2 by inactivating word lines WL1 and WL2, the dummy cells DC1 and DC2 are electrically connected to the bit lines BL1 and BL2 by activating dummy word lines DWL1 and DWL2, and the sense amplifier SA is maintained in an active state. Thereby, data that has been amplified by the sense amplifier SA before the equalizing operation is written into the dummy cells DC1 and DC2. Two pieces of data (electric charge) written into the dummy cells DC1 and DC2 are reverse to each other. Thereafter, the pair of bit lines BL1 and BL2 are equalized together with the dummy cells DC1 and DC2 by inactivating the sense amplifier SA and activating the equalizing circuit EC. Thereafter, when the equalizing circuit EC is inactivated prior to accessing the memory cell MC1, the bit lines BL1 and BL2 being maintained at an equalizing potential becomes floating.

When the memory cell MC1 on the bit line BL1 is accessed, the dummy word line DWL1 is inactivated (low level) first, and the dummy cell DC1 is electrically disconnected from the bit line BL1. At this point, due to coupling noise received from the dummy word line DWL1 (in which coupling noise between a gate electrode of a transistor of the dummy cell DC1 and a source electrode connected to the bit line BL1 is dominant), the potential of the bit line BL1 slightly drops from the equalizing potential. Thereafter, the memory cell MC1 is connected to the bit line BL1 by activating the word line WL1 (high level). At this point, due to coupling noise received from the word line WL1 (in which coupling noise between a gate electrode of a transistor of the memory cell MC1 and a source electrode connected to the bit line BL1 is dominant), the potential of the bit line BL1 returns to the equalizing potential. In this manner, the coupling noise between the word line WL1 and the dummy word line DWL1 can be cancelled in relation to the bit line BL1. This is because the memory cell MC1 and the dummy cell DC1 have the same structure as each other. Thereafter, when the sense amplifier SA is activated, its amplification operation can be performed in a state where capacitances of the pair of bit lines BL1 and BL2 are balanced, thereby improving sensing margin. In detail, since the dummy word line DWL1 is inactivated so that the dummy cell DC1 is electrically disconnected from the bit line BL1, charge sharing is performed between electric charge supplied from the memory cell MC1 to the bit line BL1 and electric charge of the bit line BL1. Thus, a difference in potential between the bit lines BL1 and BL2 that indicates a difference between charge amounts thereof is amplified by the sense amplifier SA. In a comparison example in which the dummy word line DWL1 is inactivated and the word line WL1 is activated simultaneously, so as to be brought into a skew state, the charge sharing is performed between electric charge of the memory cell MC1 and electric charge of the bit line BL1 and the dummy cell DC1, and therefore the corresponding difference in potential between the bit lines BL1 and BL2 is reduced.

Further, after the memory cell MC1 to be accessed is read out and restored by the sense amplifier SA, the memory cell MC1 is electrically disconnected from the bit line BL1 by inactivating the word line WL1. Subsequently, the dummy cell DC1 is electrically connected to the bit line BL1 again by activating the dummy word line DWL1 again, and thereafter controls for inactivating the sense amplifier SA and activating the equalizing circuit EC are performed. That is, the equalizing operation is performed in a state where the dummy cells DC1 and DC2 are electrically connected to the corresponding bit lines BL1 and BL2. In detail, for example, the dummy cell DC1 has a charge amount of HIGH in the same manner as the bit line BL1 whose potential is amplified to HIGH, while the dummy cell DC2 has a charge amount of LOW in the same manner as the bit line BL2 whose potential is amplified to LOW. In this state, charge sharing is performed by the equalizing circuit EC between electric charge of the bit line BL1 and the dummy cell DC1 and electric charge of the bit line BL2 and the dummy cell DC2. Thus, each of potentials of the bit lines BL1 and BL after the charge sharing returns to an ideal level corresponding to half charge amount. In addition, when the memory cell MC2 on the other bit line BL2 is accessed instead of the memory cell MC1 on the one bit line BL1, the above-described operation can be assumed in the same manner and a configuration laterally symmetrical to that in FIG. 1 may be considered.

Figure 2:
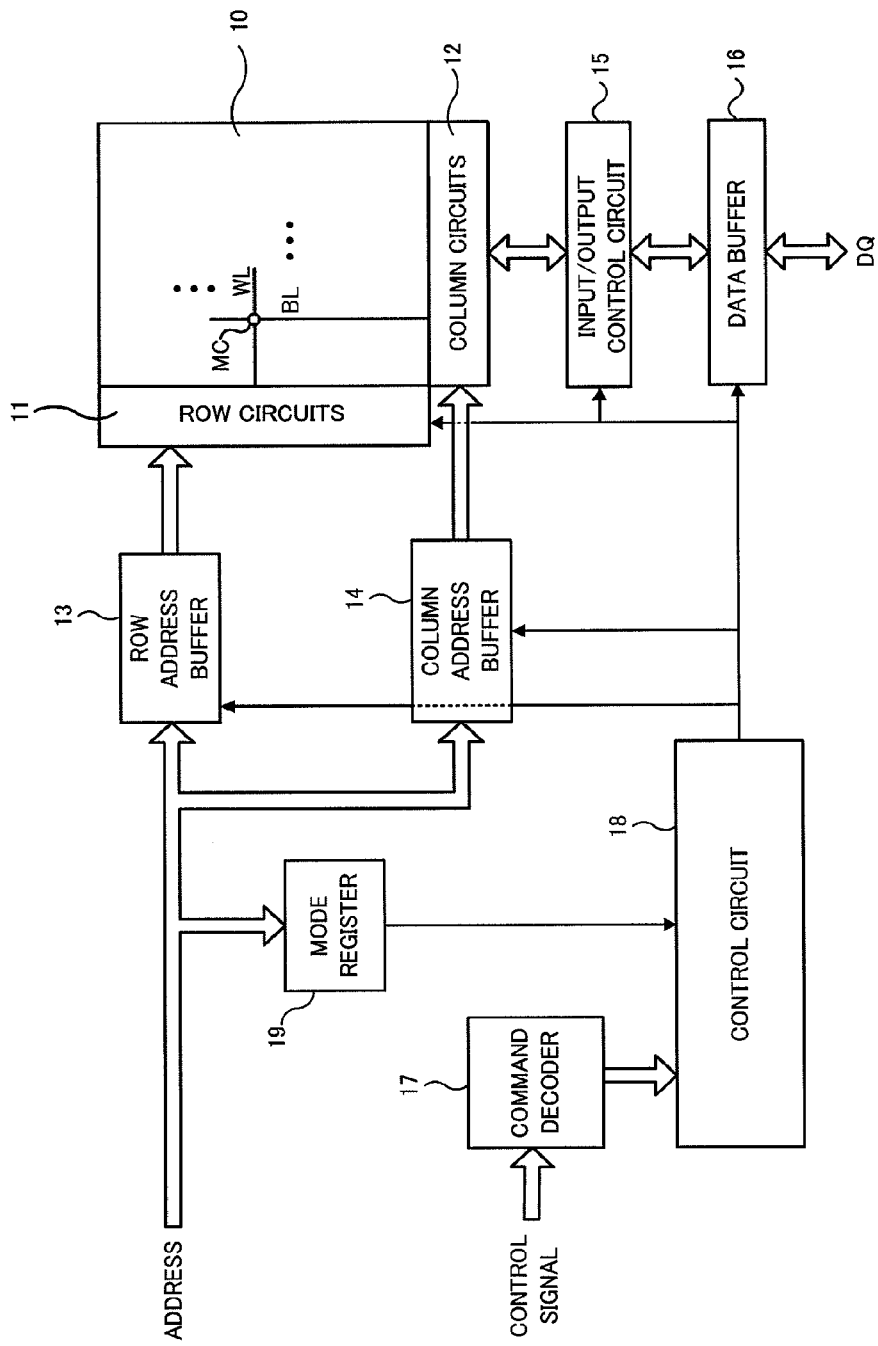
FIG. 2 is a block diagram showing an entire configuration of a DRAM of an embodiment.

Further embodiments will be described in the followings. FIG. 2 is a block diagram showing an entire configuration of a DRAM (Dynamic Random Access Memory) as a semiconductor device of an embodiment. The DRAM shown in FIG. 2 is provided with a memory cell array 10 including a large number of memory cells MC arranged at intersections of a plurality of word lines WL and a plurality of bit lines BL, and row circuits 11 and column circuits 12 that are attached to the memory cell array 10. The row circuits 11 includes a plurality of circuits provided corresponding to the plurality of word lines WL, and the column circuits 12 includes a plurality of circuits including sense amplifiers SA provided corresponding to the plurality of bit lines BL. In addition, the memory cell array 10 includes a plurality of dummy word lines DWL and a plurality of dummy cells DC that correspond to the plurality of word lines WL and a plurality of memory cells MC, which will be described in detail later.

An externally received address includes a row address and a column address. The row address is stored in a row address buffer 13 and sent to the row circuits 11. The column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ).

A command decoder 17 determines a command for the DRAM based on externally received control signals and sends the command to a control circuit 18. The control circuit 18 controls operations of respective parts of the DRAM according to a command type determined by the command decoder 17. Command types include, for example, an active command for activating the memory cell array 10, read and write commands for reading and writing data of the activated memory cell array 10, and a precharge command for inactivating the memory cell array 10. The active command and the precharge command are associated with controls of the word lines WL, the dummy word lines DWL and the sense amplifiers SA. The read command and the write command enable data transfer between the memory cells MC and the data buffer 16 via the sense amplifiers SA. Operation control of the control circuit 18 is performed in conjunction with an internal clock (not shown). A mode register 19 selectively sets operation modes of the DRAM based on the above address and sends setting information to the control circuit 18. In the embodiments, the control circuit 18 controls operations of the memory cells MC of the memory cell array 10, the sense amplifiers SA, the equalizing circuit EC, and the like, in an operation of the memory cell array 10 associated with the commands, as described later.

Figure 3:
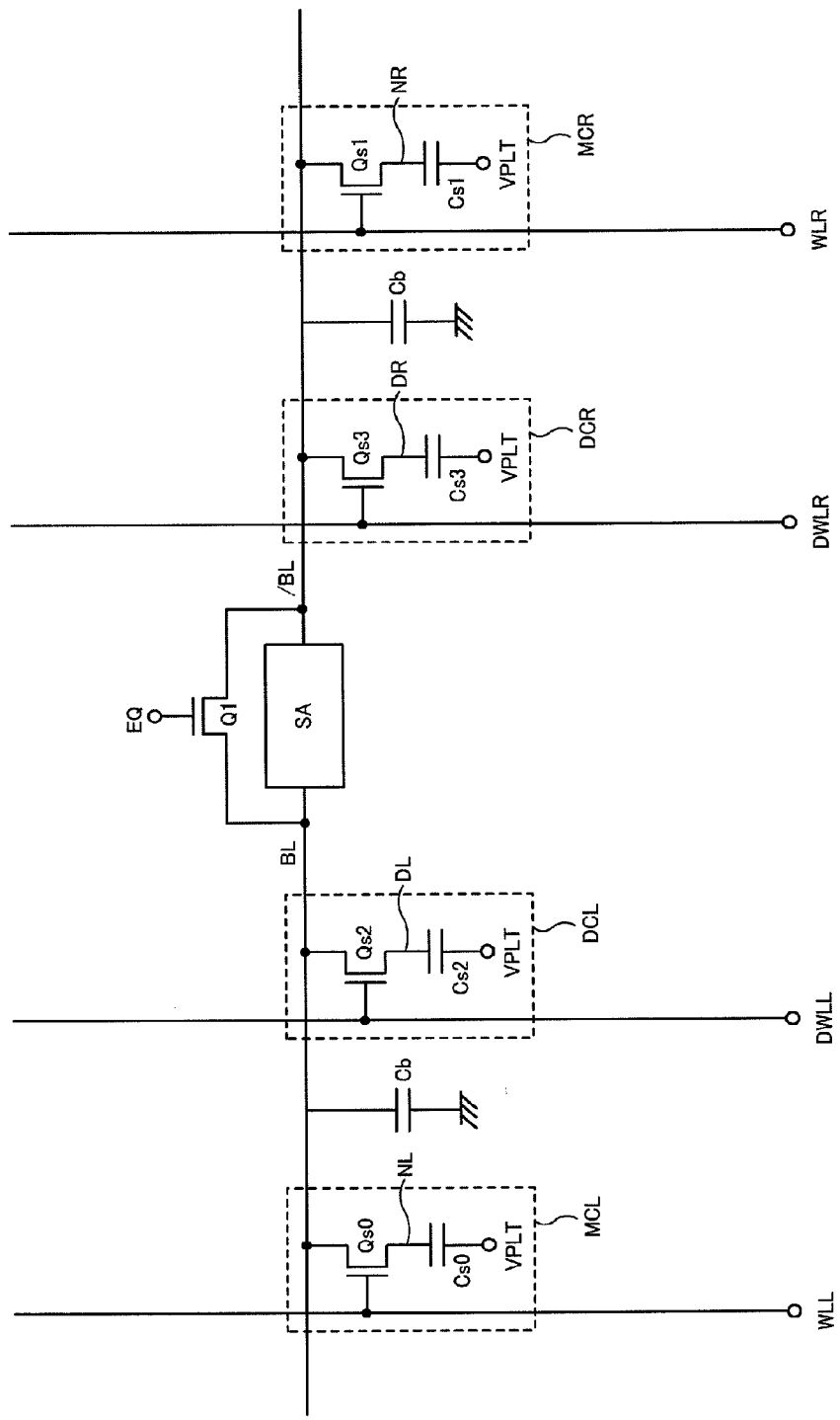
FIG. 3 is a diagram showing a configuration of a primary part of a memory cell array 10 of FIG. 2.

Next, FIG. 3 shows a configuration of a primary part of the memory cell array 10 of FIG. 2. In FIG. 3, there are provided a sense amplifier SA arranged at the center, a bit line BL, a word line WLL, a dummy word line DWL, a memory cell MCL and a dummy cell DCL that are respectively arranged on a left side of the sense amplifier SA, a bit line /BL, a word line WLR, a dummy word line DWLR, a memory cell MCR and a dummy cell DCR that are respectively arranged on a right side of the sense amplifier SA, and an equalizing NMOS transistor Q1 connected to a pair of bit lines BL and /BL.

The pair of bit lines BL and /BL form a complementary pair and are connected to two input terminals of the sense amplifier SA of a differential type. The memory cell MCL (the first memory cell) is arranged at an intersection of the bit line BL (the first bit line) and the word line WLL on the left, and the memory cell MCR (the second memory cell) is arranged at an intersection of the bit line /BL (the second bit line) and the word line WLR on the right. Each of the memory cells MCL and MCR is a 1T1C type memory cell composed of a selection NMOS transistor Qs (Qs0, Qs1) and a capacitor Cs (Cs0, Cs1) that stores data as electric charge. Further, the dummy cell DCL (the first dummy cell) is arranged at an intersection of the bit line BL and the dummy word line DWLL on the left, and the dummy cell DCR (the second dummy cell) is arranged at an intersection of the bit line /BL and the dummy word line DWLR on the right. Each of the dummy cells DCL and DCR is a 1T1C type memory cell composed of a selection NMOS transistor Qs (Qs2, Qs3) and a capacitor Cs (Cs2, Cs3) that stores data as electric charge.

All of the memory cells MCL, MCR and the dummy cells DCL, DCR have the same structure. Gates of the selection MOS transistors Qs0, Qs1, Qs2 and Qs3 are connected to the word lines WLL, WLR and the dummy word lines DWLL, DWLR, in this order. Sources of the selection MOS transistors Qs0 and Qs2 are connected to the bit line BL, and sources of the selection MOS transistors Qs1 and Qs3 are connected to the bit line /BL. Each of the capacitors Cs0, Cs1, Cs2 and Cs3 has one electrode (plate electrode) to which a plate potential VPLT is commonly applied and the other electrode (storage node) represented as nodes NL, NR, DL and DR which is connected to a drain of the selection MOS transistor Qs.

FIG. 3 shown only one memory cell MCL and one memory cell MCR for the simplicity. However, there are actually provided a plurality of memory cells MCL at intersections of a plurality of word lines WLL and the bit line BL on the left, and a plurality of memory cells MCR at intersections of a plurality of word lines WLR and the bit line /BL on the right. In addition, a parasitic capacitance Cb is attached to each of the pair of bit lines BL and /BL, as shown in FIG. 3.

The sense amplifier SA connected to the pair of bit lines BL and /BL is a differential amplifier that amplifies a difference in potential between one bit line BL and the other bit line BL to a power supply voltage VDD and a ground potential VSS. Thus, when amplifying one of signal voltages of the pair of bit lines BL and /BL, a potential of the other thereof is used as a reference potential. Further, the equalizing NMOS transistor Q1 connected to the pair of bit lines BL and /BL functions as an equalizing circuit, whose switching is controlled in response to an equalizing control signal EQ applied to its gate. When the equalizing control signal EQ is set to HIGH to activate the equalizing circuit, the NMOS transistor Q1 turns on so that the pair of bit lines BL and /BL are short-circuited, and the respective potentials are equalized. Meanwhile, when the equalizing control signal EQ is set to LOW to inactivate the equalizing circuit, the NMOS transistor Q1 turns off so that the pair of bit lines BL and /BL are electrically disconnected from each other.

Figure 4:
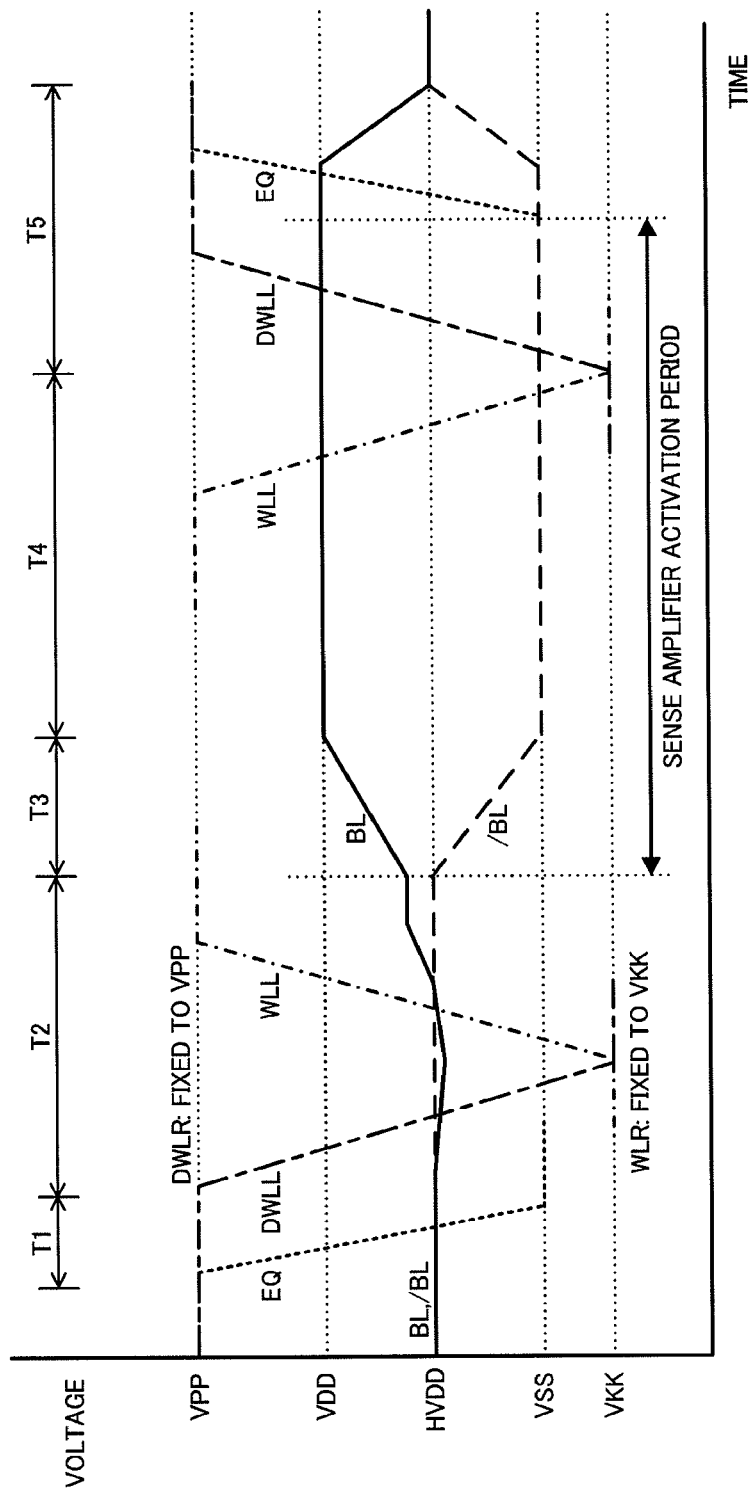
FIG. 4 is a diagram showing operation waveforms when reading data "1" stored in a memory cell MCL in the configuration of FIG. 3.

Next, an operation of the memory cell array 10 of an embodiment will be described. FIG. 4 shows operation waveforms when reading data "1" stored in the memory cell MCL in the configuration of FIG. 3. In an initial period of FIG. 4 (an equalization period prior to an equalization suspension period T1: the first period), the equalizing control signal EQ is kept at HIGH (positive voltage VPP), and the pair of bit lines BL and /BL are in a state of being short-circuited through the equalizing NMOS transistor Q1 being ON, which have been equalized to an equalizing potential HVDD. Here, the equalizing potential HVDD is set to an intermediate potential between the power supply voltage VDD as a high level of the bit lines BL and /BL and the ground potential VSS as a low level of the bit lines BL and /BL.

Further, in the initial period, both the dummy word lines DWLL and DWLR are in a state of being driven to HIGH (the positive voltage VPP) as a selected state. Thereby, one dummy cell DCL is connected to the bit line BL, and the other dummy cell DCR is connected to the bit line /BL. In this case, potentials of the nodes DL and DR of the dummy cells DCL and DCR are maintained at the equalizing potential HVDD. On the other hand, the word lines WLL and WLR on both sides have been set to LOW (negative voltage VKK) as a non-selected state. Thus, the memory cells MCL and MCR are not connected to the bit lines BL and /BL.

In the equalization suspension period T1 (the second period), the equalizing control signal EQ is set to LOW (the ground potential VSS) as a non-active state, and the equalizing NMOS transistor Q1 turns off so that the pair of bit lines BL and /BL are disconnected from each other. Therefore, the pair of bit lines BL and /BL become floating in a state of being maintained at the equalizing potential HVDD respectively.

Subsequently, in a memory cell selection period T2 (the third period), one dummy word line DWLL is set to LOW (the negative voltage VKK) as a non-selected state, and the dummy cell DCL is electrically disconnected from the bit line BL. As shown in FIG. 4, the potential of the bit line BL slightly drops from the equalizing potential HVDD due to influence of coupling noise from the dummy word line DWLL to the bit line BL (coupling between the gate and source). On the other hand, the other dummy word line DWLR is kept at HIGH (the positive voltage VPP) as a selected state, the dummy cell DCR continues to be connected to the bit line /BL. Thereafter, one word line WLL is driven to HIGH (the positive voltage VPP) as a selected state. Thereby, the memory cell MCL is connected to the bit line BL, and a signal voltage of a predetermined level corresponding to data "1" is read out to the bit line BL. In addition, the other word line WLR and the corresponding memory cell MCR remain in an original state. At this point, the potential of the bit line BL is returning to the equalizing potential HVDD due to influence of coupling noise from the word line WLL to the bit line BL (coupling between the gate and source), and in parallel the signal voltage of the predetermined level corresponding to data "1" is read out to the bit line BL. That is, potential fluctuation due to the coupling noise of the dummy word line DWLL is cancelled by potential fluctuation due to the coupling noise of the word line WLL. In the embodiments, the dummy word line DWLL is set to LOW first so as to bring the dummy cell DCL into the non-selected state in the memory cell selection period T2, and thereafter the word line WLL is set to HIGH so as to bring the memory cell MCL into the selected state. Therefore, it is possible to effectively prevent the level of the read signal from decreasing due to the electric charge flowing into the dummy cell DCL.

In an amplification period T3 (the fourth period), a sense amplifier activation period is started so that the sense amplifier SA is activated, which senses and amplifies the pair of bit lines BL and /BL. As a result, the potential of the bit line BL rises to the power supply voltage VDD corresponding to data "1", and the potential of the bit line /BL drops to the ground potential VSS corresponding to data "0". At this point, the memory cell MCL is connected to one bit line BL while the dummy cell DCR is connected to the other bit line /BL, and therefore respective capacitances viewed from the two input terminals of the sense amplifier SA are equal to each other. That is, two loads in the operation of the sense amplifier SA are balanced, so as to avoid unbalance state therebetween. Thus, it is possible to suppress a decrease in sensing margin of the sense amplifier SA.

In a restoring period T4 (the fifth period), high-level data (the power supply voltage VDD) corresponding to data "1" is restored into the memory cell MCL. Then, the word line WLL returns to LOW (the negative voltage VKK) as a non-selected state, and the memory cell MCL is disconnected from the bit line BL. Meanwhile, since the dummy word line DWLR is kept at HIGH, the dummy cell DCR continues to be connected to the bit line /BL, in a state where the potential of the node DR is driven to the ground potential VSS.

In an equalization period T5 (the first and sixth periods), the dummy word line DWLL is driven to HIGH as the selected state again, and the dummy cell DCL is connected to the bit line BL again. Since the sense amplifier SA is in an active state at this point, the capacitor Cs2 of the dummy cell DCL is charged from HVDD-a to the power supply voltage VDD at the node DL. The a indicates an amount of a decrease in potential of the node DL of the dummy cell DCL due to the influence of the coupling noise in the dummy cell DCL when the dummy word line DWLL is set to LOW as the non-selected state in the memory cell selection period T2. In this manner, the memory cell MCL is brought into the non-selected state by setting the word line WLL to LOW first, and thereafter the dummy cell DCL is brought into the selected state again by setting the dummy word line DWLL to HIGH. Therefore, it is possible to prevent a decrease in charge amount in a restoring operation in which, for example, the high-level data (data "1") is read out from the memory cell MCL and subsequently the high-level data is restored into the memory cell MCL. Specifically, the high-level data is restored into the memory cell MCL first, the word line WLL is set to LOW so as to disconnect the memory cell MCL from the bit line BL, and thereafter, by selecting the dummy cell DCL storing HVDD-α at the node DL. Therefore, it is possible to suppress a decrease in potential of the high level of the bit line BL due to the electric charge flowing from the bit line BL to the node DL, which corresponds to a decrease in charge amount in restoring the high-level data into the memory cell MCL. The decrease in charge amount occurs when setting the dummy word line DWLL to HIGH before setting the word line WLL to LOW.

Thereafter, the sense amplifier SA is brought into a non-active state when the sense amplifier activation period finishes. Further, the equalizing control signal EQ is set to HIGH (the positive voltage VPP) as an active state, and the equalizing NMOS transistor Q1 turns on so that one bit line BL and the other bit line /BL are equalized. At this point, the node DR of the capacitor Cs3 of the dummy cell DCR has been driven to the ground potential VSS and is connected to the bit line /BL. The node DL of the capacitor Cs2 of the dummy cell DCL has been driven to the power supply voltage VDD and is connected to the bit line BL. Therefore, capacitances of the bit lines BL and /BL are equal to each other, including the dummy cells DCL and DCR. Electric charge QBL=(Cs2+Cb) VDD has been charged to one bit line BL, and electric charge/ QBL=(Cs2+Cb)VSS has been charged to the other bit line /BL. Thus, potentials of the pair of bit lines BL and /BL converge to HVDD=VDD/2 after the equalization period T5 finishes. When the dummy word line DWLL is set to HIGH after the equalizing NMOS transistor Q1 turns on, the equalization period T5 can be prolonged.

Figure 5:
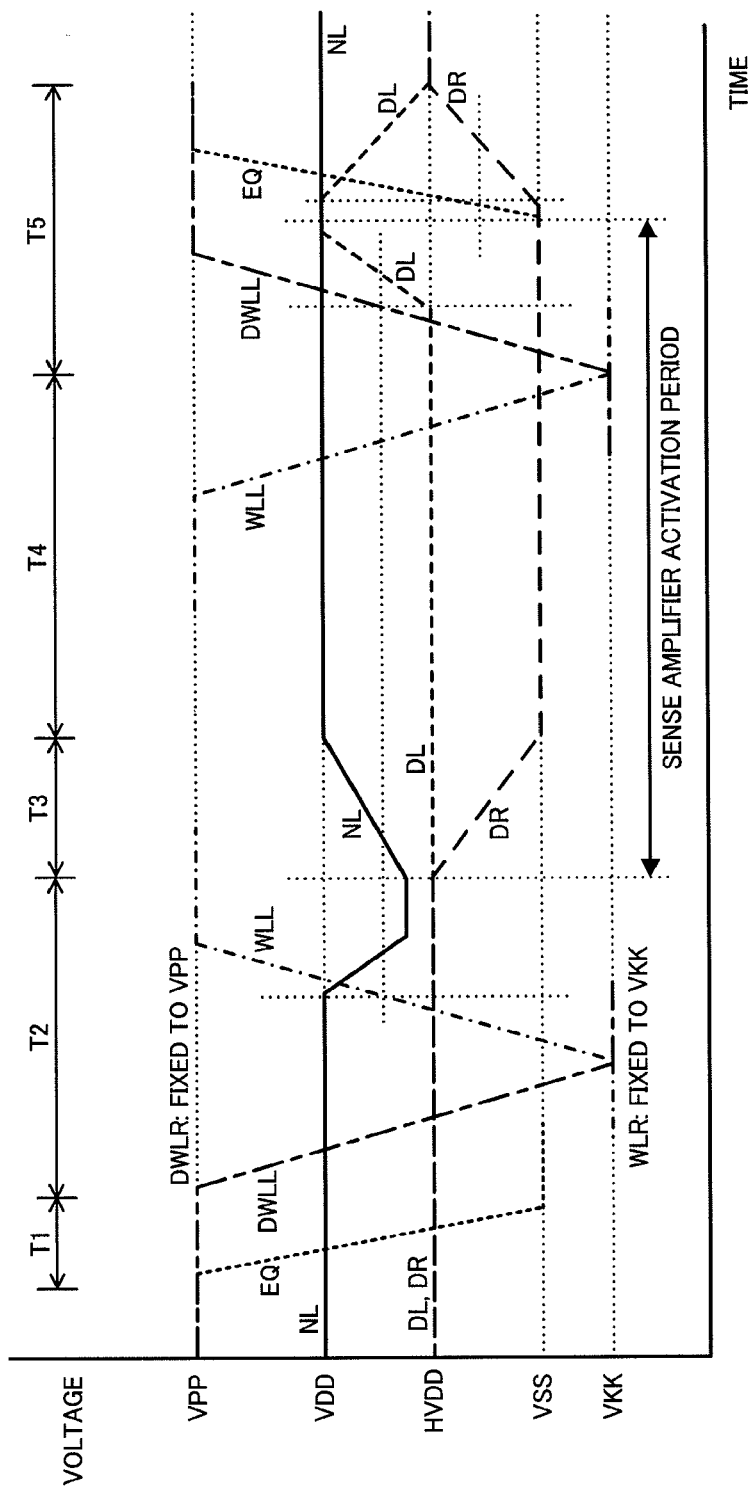
FIG. 5 is a diagram showing operation waveforms when reading data "1" stored in the memory cell MCL regarding potential transitions of a node NL of the memory cell MCL and nodes DL and DR of dummy cells DCL and DCR.

Here, FIG. 5 is a diagram showing potential transitions of the node NL of the memory cell MCL (FIG. 3) and the nodes DL and DR of the dummy cells DCL and DCR (FIG. 3), which are overlapped with the operation waveforms shown in FIG. 4. Here, the node NR of the memory cell MCR is omitted in FIG. 5 because it always remains in the non-selected state in FIG. 3. The node NL of the memory cell MCL storing the high-level data is maintained at the power supply voltage VDD from the end of the equalization period T5 to the equalization suspension period T1. Further, the dummy word lines DWLL and DWLR have been driven to HIGH (the positive voltage VPP) as the selected state, and the selection transistors Qs2 and Qs3 of the dummy cells DCL and DCR are in an ON state. Therefore, the nodes DL and DR are maintained at the bit line equalization voltage HVDD.

Subsequently, in the memory cell selection period T2, the word line WLL is driven to HIGH (the positive voltage VPP) as a selected state, and thus the memory cell MCL is selected in which the selection transistor Qs0 turns on. Thereby, charge sharing is performed between the node NL of the memory cell MCL and the bit line BL, and the potential of the node NL drops to a potential of a read signal of the bit line BL (FIG. 4).

Subsequently, in the amplification period T3, the potential of the node NL rises to the power supply voltage VDD in conjunction with the amplified potential of the bit line BL. At this point, the dummy word line DWLR has been set to HIGH, as described above, and therefore the potential of the node DR drops to the ground potential VSS in conjunction with the amplified potential of the bit line /BL. On the other hand, since the dummy word line DWLL has been set to LOW (the negative voltage VKK) as a non-selected state, the potential of the node DL continues to be maintained at HVDD-α.

Thereafter, in the equalization period T5 subsequent to the restoring period T4, the dummy word line DWLL is driven to HIGH as the selected state again so that the selection transistor Qs2 turns on again. Therefore, the bit line BL, which has been driven to the power supply voltage VDD by the sense amplifier SA in the active state, allows the potential of the node DL to rise to HIGH. Thereafter, when the sense amplifier activation period starting from the start of the amplification period T3 finishes, the sense amplifier SA is inactivated. Subsequently, the equalizing control signal EQ is set to HIGH (the positive voltage VPP) as an active state, and thus potentials of the nodes DL and DR of the dummy cells DCL and DCR converge to the equalizing potential HVDD in conjunction with the pair of bit lines BL and /BL that converge to the equalizing potential HVDD, as described above.

Figure 6:
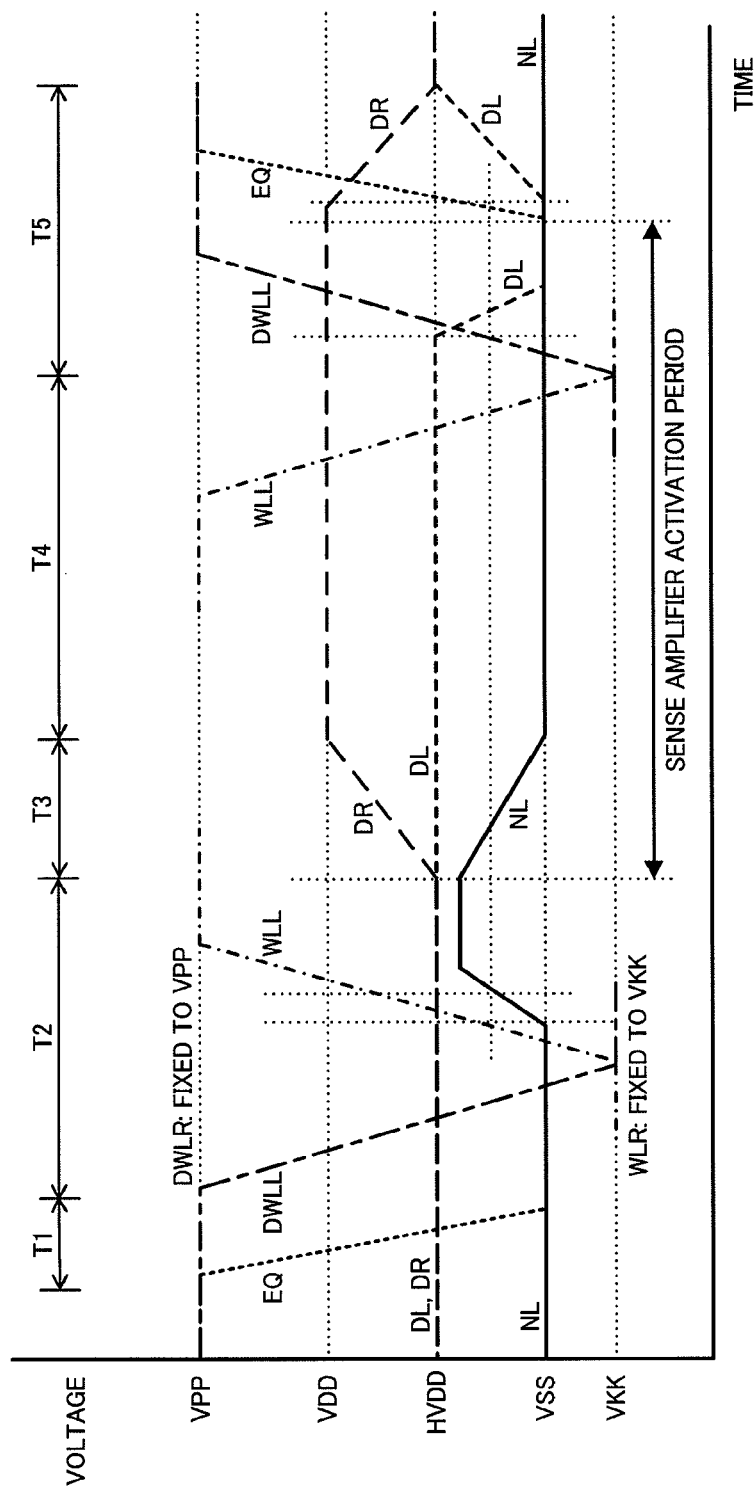
FIG. 6 is a diagram showing operation waveforms when reading out data "0" stored in the memory cell MCL regarding potential transitions of the node NL of the memory cell MCL and the nodes DL and DR of the dummy cells DCL and DCR.

Although FIG. 5 shows the operation waveforms when reading out the data "1" stored in the memory cell MCL, FIG. 6 shows operation waveforms when reading out data "0" stored in the memory cell MCL. In FIG. 6, behavior of each operation waveform is common to that in FIG. 5, and the operation waveforms of the nodes NL, DL and DR of FIG. 5 may be assumed to be inverted with respect to the equalizing potential HVDD, description of which will be omitted.

Figure 7:
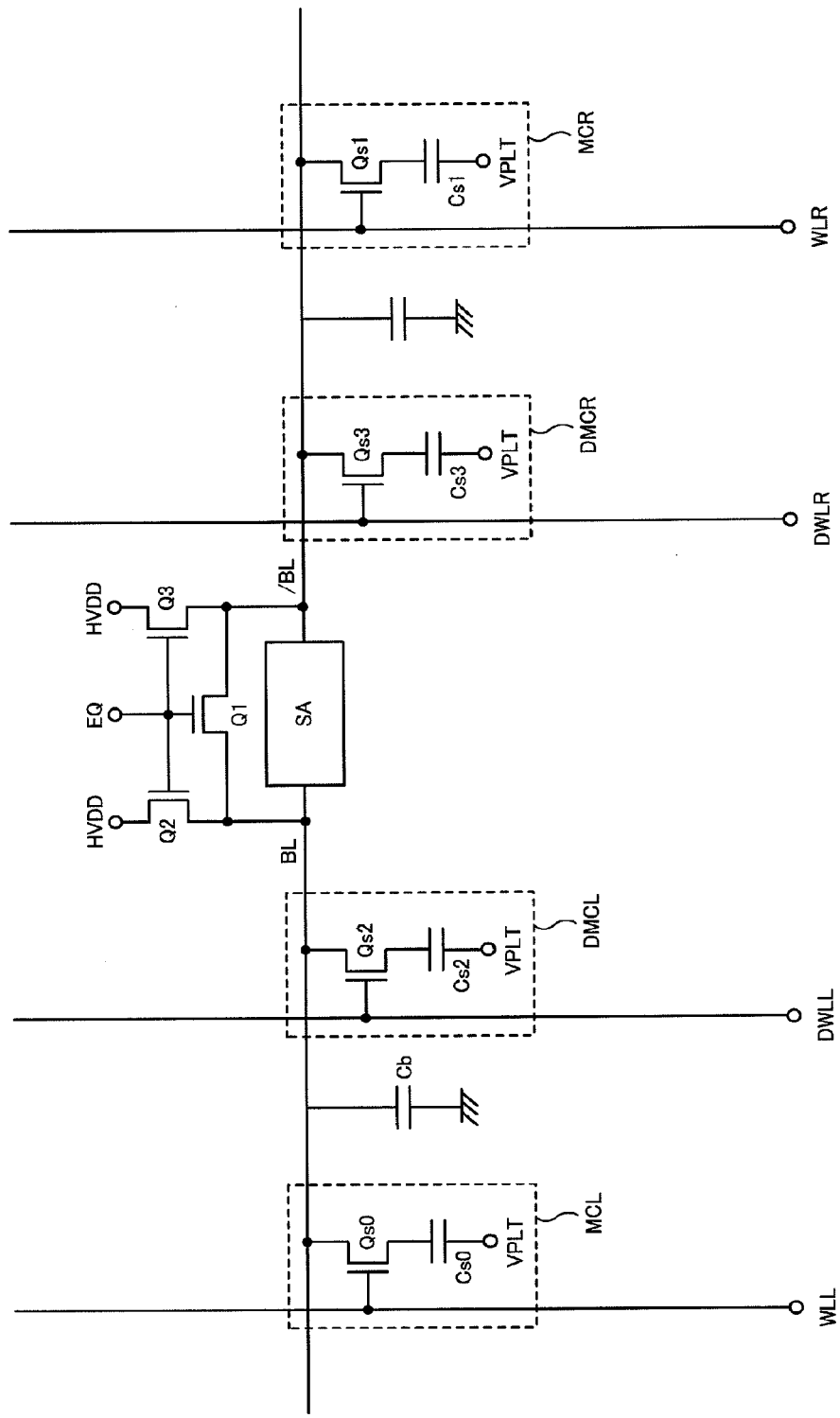
FIG. 7 is a diagram showing a modification of the memory cell array 10 of the embodiments shown in FIG. 3.

Next, a modification of the memory cell array 10 of the embodiments will be described. FIG. 7 shows one of modifications of the memory cell array 10 shown in FIG. 3. In this modification, the configuration of the equalizing circuit is different from FIG. 3, in which there are additionally provided two precharge NMOS transistors Q2 and Q3, in addition to the equalizing NMOS transistor Q1. The NMOS transistor Q2 functions as the first precharge circuit whose switching is controlled in response to the equalizing control signal EQ applied to its gate. The NMOS transistor Q3 functions as the second precharge circuit whose switching is controlled in response to the equalizing control signal EQ applied to its gate. When the equalizing control signal EQ is HIGH, both the NMOS transistors Q2 and Q3 turn on, and the equalizing potential HVDD is supplied to the pair of bit lines BL and /BL. When the equalizing control signal EQ is LOW, both the NMOS transistors Q2 and Q3 turn off, and the equalizing potential HVDD is stopped to be supplied to the pair of bit lines BL and /BL.

The NMOS transistors Q2 and Q3 are used to prevent the potentials of the pair of bit lines BL and /BL from deviating from the equalizing potential HVDD to be maintained as a precharge potential, due to leak current or the like. The NMOS transistors Q2 and Q3 are formed in sizes smaller than the equalizing NMOS transistor Q1. Here, the memory cell array 10 of the modification shown in FIG. 7 basically operates in the same manner as that in FIGS. 4 to 6. Thus, when the bit line equalizing operation is performed by the control circuit 18 that controls the word lines WLL, WLR and the dummy word lines DWLL, DWLR, as described in the embodiments, it is possible to reduce an area of the memory cell array 10 since the precharge NMOS transistors Q2 and Q3 formed in the small size do not generate noise.

Further, another modification of the memory cell array 10 of the embodiments can be configured, in which the equalizing NMOS transistor Q1 is removed from the equalizing circuit shown in FIG. 7 and the equalizing circuit may be configured only using the two precharge NMOS transistors Q2 and Q3. In this configuration, if the capacitances of the pair of bit lines BL and /BL are equal to each other in the equalization period, a charge amount transferred from the equalizing potential HVDD to one bit line BL becomes equal to a charge amount transferred from the other bit line /BL to the equalizing potential HVDD. Therefore, the NMOS transistors Q2 and Q3 have substantially the same function as the equalizing NMOS transistor Q1, and it is possible to prevent a situation in which the pair of bit lines BL and /BL deviate from the equalizing potential HVDD to be maintained as the precharge potential. This modification can be applied to a case in which it is difficult to lay out the equalizing NMOS transistor Q1. In this case, the two precharge NMOS transistors Q2 and Q3 are formed in sizes larger than those in the configuration including the equalizing NMOS transistor Q1.

According to the embodiments, in a memory cell array provided with dummy cells of the same structure as memory cells, capacitances of a bit line pair (BL1 and BL2) connected to a sense amplifier can be completely equal to each other, in an amplification operation by the sense amplifier and in a bit line equalizing operation. As a result, sensing margin in the read operation of a memory cell can be improved, and the bit line equalizing operation can be performed with a higher speed by an equalizing circuit. In this case, when reading the memory cell at a subsequent cycle, deviation of a reference potential of the sense amplifier is reduced, and therefore it is possible to reduce bit line noise. Meanwhile, in a read operation of a selected memory cell, it is possible to prevent a reduction in potential of a read signal using a dummy cell on a selected bit line, and in a restoring operation of the selected memory cell, it is possible to prevent a reduction in charge amount for writing the selected memory cell due to a selection operation of the dummy cell on the selected bit line. Further, in a precharge period, it is possible to prevent a situation in which the potential of the dummy cell deviates from the equalizing potential due to leak current of the dummy cell. Thereby, in the read operation, it is possible to prevent the dummy cells from being a noise source. Furthermore, when selecting the memory cell, electric charge supplied from the memory cell to the bit line does not flow into the dummy cell, thereby suppressing a reduction in the sensing margin.

In the foregoing, the preferred embodiments have been described. However, the invention can variously be modified without departing the essentials of the present invention. For example, various circuit configurations can be employed for circuit portions included in the memory cell array 10 without being limited to the circuit configurations shown in the embodiments, and both of a hierarchical bit line structure and a non-hierarchical bit line structure can be employed. Further, various circuit configurations can be also employed for circuit portions on the periphery of the memory cell array 10 (FIG. 2) without being limited to the circuit configurations shown in the embodiments.

The invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the invention can be applied to various devices such as SOC (System on Chip), MCP (Multi Chip Package) and POP (Package on Package) and the like.

Further, transistors used for the invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor.

The invention can be applied to devices based on various combinations or selections of the disclosure of the embodiments. That is, the invention covers various modifications which those skilled in the art can carry out in accordance with all disclosures including claims and technical ideas.

The invention claimed is:

1. A method for accessing a DRAM having first and second bit lines connected to a sense amplifier, the method comprising:
   inactivating an equalize transistor connected between the first bit line and the second bit line;
   inactivating a first dummy word line to disconnect a first dummy memory cell from the first bit line;
   activating a first word line to connect a first memory cell to the first bit line;
   activating the sense amplifier;
   inactivating the first word line to disconnect the first memory cell from the first bit line;
   activating the first dummy word line to connect the first dummy memory cell to the first bit line;
   inactivating the sense amplifier; and
   activating the equalize transistor,
   wherein a second dummy word line connected to a second dummy memory cell remains activated to connect the second dummy memory cell to the second bit line and a second word line connected to a second memory cell remains deactivated to disconnect the second memory cell from the second bit line throughout the accessing.

2. The method as claimed in claim 1 wherein the first memory cell, the second memory cell, the first dummy memory cell, and the second dummy memory cell have the same structure.

3. The method as claimed in claim 1 wherein the first memory cell, the second memory cell, the first dummy memory cell, and the second dummy memory cell comprise NMOS transistors.

4. The method as claimed in claim 3 wherein the first word line, the second word line, the first dummy word line, and the second dummy word line are driven to a voltage higher than a power supply voltage provided to the sense amplifier when activated.

5. The method as claimed in claim 3 wherein the first word line, the second word line, the first dummy word line, and the second dummy word line are driven to a voltage lower than a ground potential voltage provided to the sense amplifier when inactivated.

6. The method as claimed in claim 1 wherein the equalize transistor comprises an NMOS transistor.

7. The method as claimed in claim 6 wherein the equalize transistor is driven to a voltage higher than a power supply voltage provided to the sense amplifier when activated.

8. The method as claimed in claim 1 wherein the DRAM further comprises a first precharge transistor connected between the first bit line and an equalizing potential, and a second precharge transistor connected between the second bit line and the equalizing potential.

* * * * *